United States Patent [19]
Tan et al.

[11] Patent Number: 5,991,134
[45] Date of Patent: Nov. 23, 1999

[54] SWITCHABLE ESD PROTECTIVE SHUNTING CIRCUIT FOR SEMICONDUCTOR DEVICES

[75] Inventors: Huynh Tan, Los Gatos; Donald L. Wollesen, Saratoga, both of Calif.

[73] Assignee: Advanced Micro Devices, Inc., Sunnyvale, Calif.

[21] Appl. No.: 08/878,783

[22] Filed: Jun. 19, 1997

[51] Int. Cl.⁶ .................................................. H02H 3/22
[52] U.S. Cl. .............................. 361/56; 361/111; 257/355
[58] Field of Search ........................ 361/56, 111, 91, 361/212, 220; 257/355, 356, 360, 363

[56] References Cited

U.S. PATENT DOCUMENTS

| | | | |
|---|---|---|---|
| 4,630,162 | 12/1986 | Bell et al. | 361/56 |
| 4,819,047 | 4/1989 | Gilfeather et al. | 361/56 |
| 4,868,705 | 9/1989 | Shiochi et al. | 361/91 |
| 4,937,700 | 6/1990 | Iwahashi | 361/91 |
| 5,208,719 | 5/1993 | Wei | 361/56 |
| 5,479,039 | 12/1995 | Lien | 257/356 |
| 5,565,790 | 10/1996 | Lee | 326/30 |

*Primary Examiner*—Michael J. Sherry
*Attorney, Agent, or Firm*—Fliesler, Dubb, Meyer & Lovejoy

[57] ABSTRACT

An electrostatic discharge protection circuit having a low impedance conduction path connecting all of a particular device's input/output paths to ground potential via switchable devices exhibiting low resistance when power is not applied to the device and very high resistance when power is applied to the device.

34 Claims, 10 Drawing Sheets

SWITCHABLE ESD PROTECTIVE SHUNTING CIRCUIT FOR SEMICONDUCTOR DEVICES

FIELD OF THE INVENTION

The present invention generally relates to circuit protection and, more particularly, to a switchable protection device which improves electro-static discharge protection.

BACKGROUND OF THE INVENTION

Electro-static charge is a stationary electric charge which can accumulate on various surfaces. An electro-static discharge (ESD) occurs when the electro-static charge becomes substantial enough to overcome the dielectric material between any charge and another surface of lower electrical potential.

Electro-static discharge in the field of electronics can be devastating to microelectronic devices. A sharp, inadvertent voltage spike caused by an electro-static discharge can rupture the thin gate oxide of field effect transistors (FET's), or degrade a transistor's p-n junctions, effectively destroying proper integrated circuit (IC) operation.

The two most common sources of ESD stress are user handling of IC packages and machine handling of IC packages. The human body can be modeled as a 150 pF capacitor capable of storing approximately 2.0 kV, connected in series to a resistance of approximately 1.5 k$\Omega$. When the pins of the IC package are touched, a peak current equal to approximately 1.5 amperes is passed through a device which makes up the IC. With IC's having metal oxide semiconductor (MOS) devices having 1 $\mu$m or smaller geometries, discharges of approximately 1.5 amperes may damage or even destroy the gate oxides of the MOS devices if adequate ESD protection is not provided.

A machine can be modeled in the same way as the human body, except a resistance of 0 ohms is assumed. In practical applications, machine resistance is on the order of 20–40 $\Omega$. Under the machine model, a device that can withstand approximately 400 volts of electro-static charge is considered acceptable by industry standards.

A third method of modeling ESD stress caused by machine handling of devices, is referred to as the charged device model. The charged device model is used to simulate the ESD failure mechanism associated with machine handling during the packaging and testing of semiconductor devices. According to this model, an IC package is charged to a potential of between 100V–2000V. Then, the device is discharged to ground via another device pin. The charging is normally done via the substrate pin while discharging is initiated by touching a device pin with a grounded inductance probe.

The charged device model simulates an ESD event during machine handling of packaged semiconductor devices. ESD damage from machine handling is becoming more significant than ESD damage from human handling because, while attention has been focused on minimizing human ESD damage, relatively little work has been done on minimizing the effects of ESD damage caused by machines.

One current method of preventing ESD damage is to insert a diode, a field effect transistor, or bipolar transistor between the device to be protected and a connecting pin to divert the ESD spike.

A drawback with using conventional bipolar transistors is that the bipolar transistor must first be turned on to provide ESD protection. Thus, a device has no ESD protection during its manufacturing stage.

Another drawback with conventional ESD protection devices and methods is that they do not provide protection for electrostatic charge present on the surface of an IC device.

Yet another drawback with conventional ESD protection devices and methods is that they only protect integrated circuit inputs, not the actual devices fabricated on an integrated circuit. As device features become smaller and smaller, the gate oxide thickness of devices is reduced and oxide breakdown becomes more likely in non-operating devices.

Thus, there is a need to provide ESD protection for semiconductor devices in both low power, and non-operating states.

SUMMARY OF THE INVENTION

The present invention solves the aforementioned and related drawbacks associated with providing electrostatic discharge protection for integrated circuits. An ESD protection device is disclosed, which is placed between a bonding pad and the integrated circuit device to be protected, for shunting all electrostatic charge to ground potential. The ESD protection device of the present invention is used in conjunction with existing ESD structures. The ESD protection device is a transistor that is normally on when power is not provided to the device being protected, and turned off by application of a voltage less than the power supply voltage of the particular device being protected. This can be accomplished with a depletion mode metal oxide semiconductor field effect transistor (MOSFET) having a turn-off threshold voltage ($V_t$) less than the product's power supply voltage.

In a first embodiment of the present invention, the ESD protection device is connected between the bonding pads and the internal circuitry to be protected in a Delta configuration such that the bonding pads are coupled in series to ground potential. The ESD protection device includes a transistor network having first and second transistors. The first transistor having a source, drain and gate, with the source coupled to a respective bonding pad, the drain coupled to the second transistor, and the gate coupled to an external power supply, wherein any electrostatic charge is transmitted through a protection device to ground potential.

In a second embodiment of the present invention, the ESD protection device is coupled directly to an individual pin which shunts any electrostatic charge to ground potential when the internal circuitry is not in a powered-down state. Such a connection is known as a Wye configuration.

In a third embodiment of the present invention, a resistor is applied to the control gates of the ESD protection device to further eliminate any electrostatic charge which can be provided to the internal circuitry by human handling.

An advantage of the present invention is the ability to eliminate electrostatic discharge damage caused by human handling.

Another advantage of the present invention is the ability to eliminate electrostatic discharge damage caused by machine handling.

Yet another advantage of the present invention is the ability to provide electrostatic discharge protection when a device is in the manufacturing, or nonoperating stage.

Still another advantage of the present invention is that it improves device yield.

Yet still another advantage of the present invention is that the ESD protection device is switchable to thereby provide ESD protection only when needed.

BRIEF DESCRIPTION OF THE DRAWINGS

These and other advantages of the present invention will become apparent from the following description of the embodiments, taken in conjunction with the accompanying drawings, where like numerals represent like elements, in which.

DETAILED DESCRIPTION OF THE EMBODIMENTS

In a conventional integrated circuit chip package, electrical connections to an internal circuit are made via bonding pads on the surface of the integrated circuit structure. The bonding pads are accessible to the user via pins which extend from the integrated circuit chip package. Generally, the integrated circuit package will be plugged into a socket on a printed circuit board.

According to one aspect of the present invention, a p-channel transistor shunts the integrated circuit pins to ground when power is not being provided to the integrated circuit, thereby providing electrostatic discharge protection. According to a second aspect of the present invention, an n-channel transistor is used to shunt the integrated circuits pin to ground when power is not being provided to the integrated circuit, thereby providing electrostatic discharge protection. When power is provided to the integrated circuit package, the ESD protection devices are turned off and normal chip operation commences.

Figure 1:
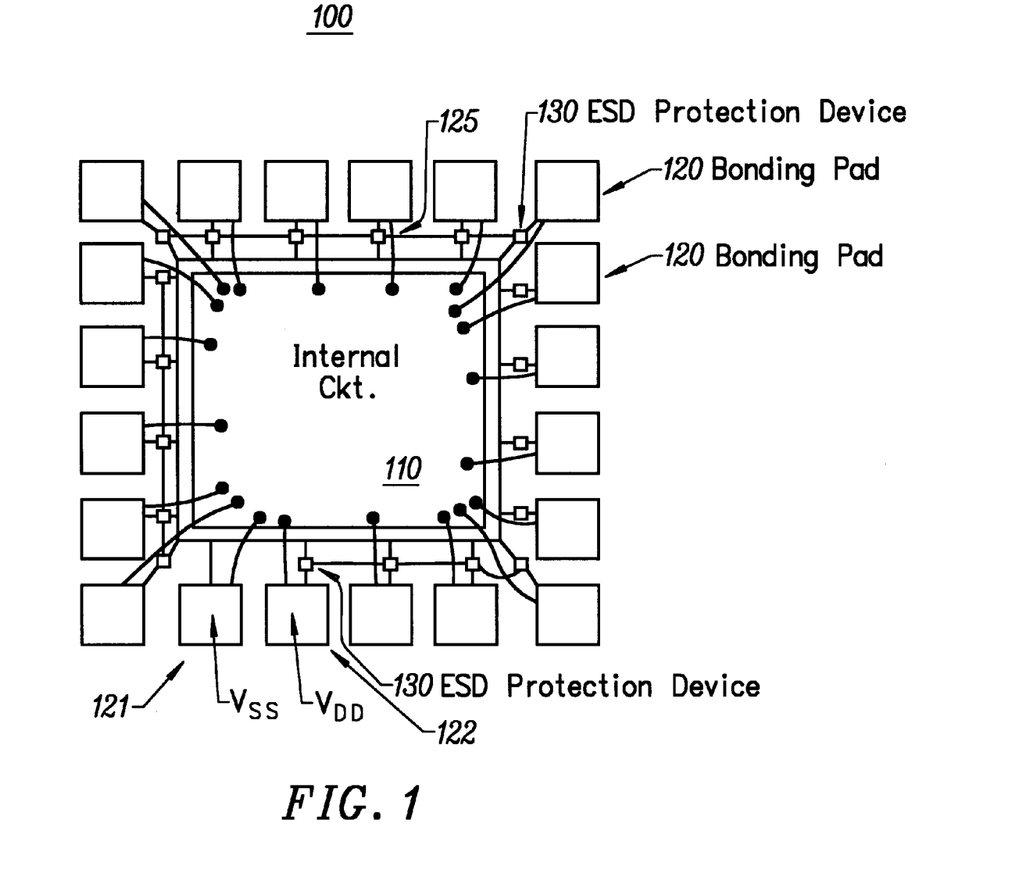
FIG. 1 presents a block diagram of an integrated circuit incorporating the electrostatic discharge protection device according to the present invention in a Delta configuration.

Referring now to FIG. 1, an integrated circuit structure 100 incorporating the ESD protection device according to the present invention is presented. In FIG. 1, the internal circuitry 110 to be protected is connected to its respective bonding pads 120 via connections 125 along with ESD protection devices 130. The ESD protection devices 130 are connected to each other, in series, to pin 121 which is coupled to $V_{SS}$, or ground potential. This type of connection is referred to as a Delta Connection. In some applications, a pin 122 coupled to $V_{DD}$, is also connected to an ESD protection device 130.

Figure 2:
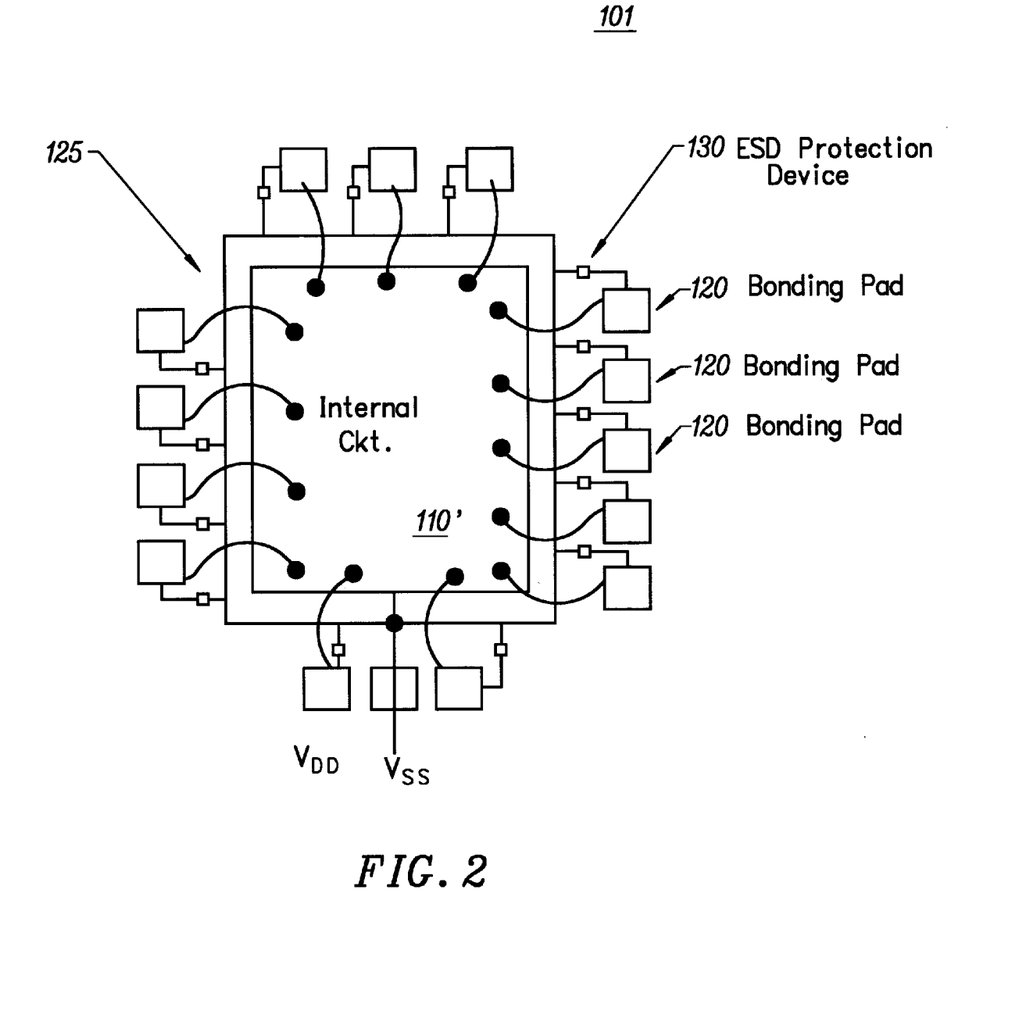
FIG. 2 presents a block diagram of an integrated circuit incorporating the electrostatic discharge protection device according to the present invention in a Wye configuration.

FIG. 2 presents a schematic diagram of an integrated circuit structure 101 incorporating the ESD protection devices according to the present invention. In FIG. 2, the internal circuit 110' to be protected is coupled to a number of bonding pads 120 via connections 125 along with ESD protection devices 130 which individually connect the respective bonding pads 120 to the internal circuit 110'. This type of connection is referred as a Wye connection. In the Wye connection scheme, each of the ESD protection devices 130 is individually connected to $V_{SS}$, or ground potential.

Referring to FIG. 1, when power is not provided to the integrated circuit 100, the ESD protection devices 130 shunt any electrostatic charge present on the internal circuit 110 being protected or the individual bonding pads 120 to $V_{SS}$. Thus, any charge present on the metal components of the device being protected will be distributed through the ESD protection devices 130 to ground, thereby preventing any electrostatic discharge that can damage the internal circuit 110. When power is provided to the integrated circuit structure 100, the ESD protection devices 130 are turned off, resulting in normal device operation.

Figure 3:
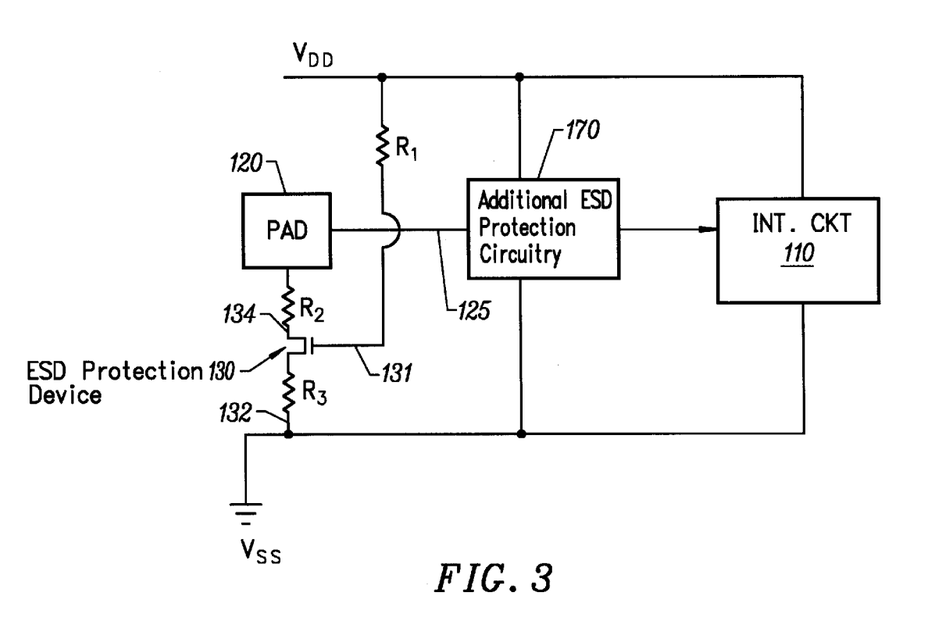
FIG. 3 presents a schematic diagram of individual pin connection in a Wye configuration to the electrostatic discharge protection device according to the present invention.

FIG. 3 presents a schematic view of an individual bonding pad connection in the Wye configuration. As shown in FIG. 3, the internal circuit 110 to be protected is connected to the bonding pad 120 via connection 125. Coupled in parallel with the bonding pad 120 and the internal circuit 110 is a switchable ESD protection device 130 of the present invention. As shown in FIG. 3, in one embodiment the ESD protection device 130 may be a p-channel transistor having a control gate 131 connected to $V_{DD}$, a first source/drain region 132 coupled to $V_{SS}$ and a second source/drain region 134 coupled to a bonding pad 120. In an alternate embodiment, additional ESD protection circuitry 170 may be coupled between the bonding pad 120 and the internal circuit 110.

In an optional configuration, a first resistor $R_1$ may be coupled between the control gate 131 and $V_{DD}$. A second resistor $R_2$ is placed between the bonding pad 120 and the second source/drain region 134 of transistor 130. Also, a third resistor $R_3$ is coupled between the first source/drain region 132 and $V_{SS}$.

Figure 4:
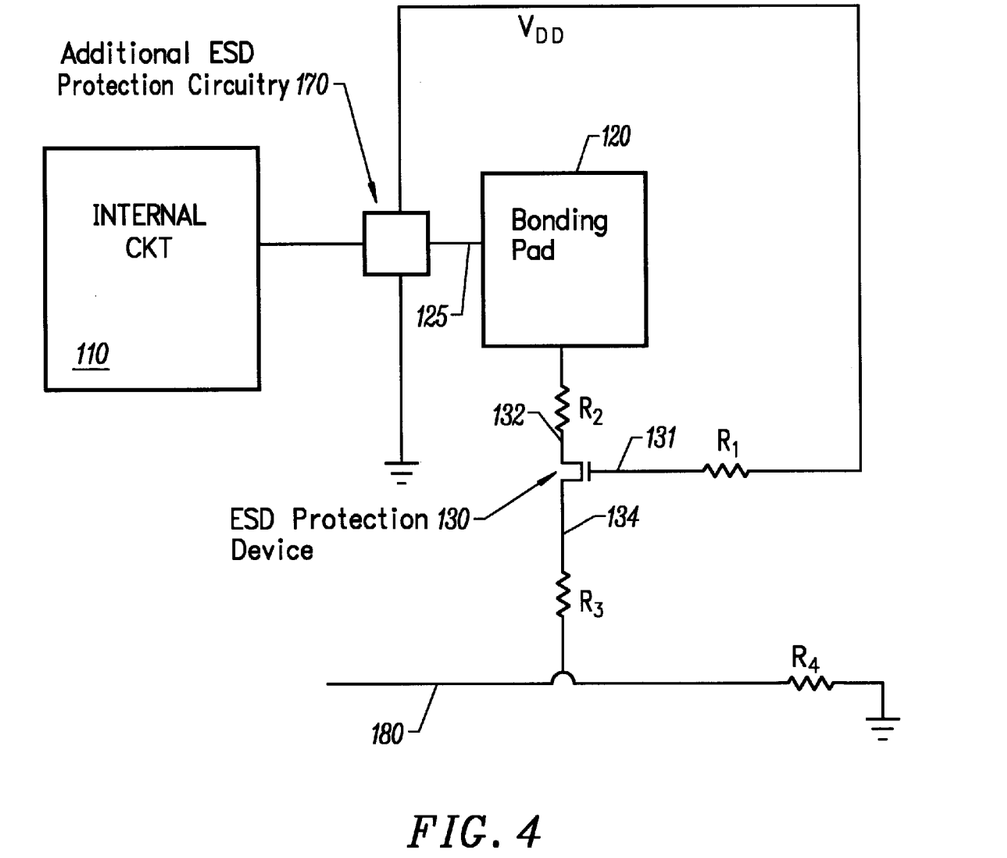
FIG. 4 presents a schematic diagram of an individual pin connection to the ESD protection device according to the present invention in a Delta configuration.

FIG. 4 presents an individual pin connection between the internal circuit 110 and the bonding pad 120 in a Delta configuration according to the present invention. In FIG. 4, the bonding pad 120 is connected to the ESD protection device 130. As shown in FIG. 4, in one embodiment, the ESD protection device 130 is a p-channel transistor having a control gate 131 connected to $V_{DD}$. A first source/drain region 132 is connected to the bonding pad 120 with a second source/drain region 134 connected to a common loop connection 180 which may be grounded at one or more places. In an alternate embodiment, additional ESD protection circuitry 170 may be coupled between the bonding pad 120 and the internal circuit 110. With the apparatus shown in FIG. 4, any electrostatic charge that is induced onto the components of the integrated circuit 110 will be shunted to ground via the ESD protection device 130, thereby providing complete ESD protection for the internal circuit 110.

In an optional configuration, a first resistor $R_1$ may be coupled to the control gate 131 of the ESD protection device (transistor) 130. A second resistor $R_2$ is coupled between the bonding pad 120 and the first source/drain region 132. A third resistor $R_3$ is coupled between the second source/drain region 134 and the common loop 180.

The structure of the ESD protection device of the present invention and the connections to an integrated circuit in order to provide ESD protection according to the present invention will now be described with reference to FIGS. 5–10. Standard processing techniques are used to form the circuitry comprising the ESD protection device of the present invention and, therefore, are not discussed in great detail.

The invention discussed below is implemented with p-type transistors. However, it should be understood that the principles of the present invention may be implemented with n-type transistors or a combination of p-type and n-type transistors.

Figure 5:
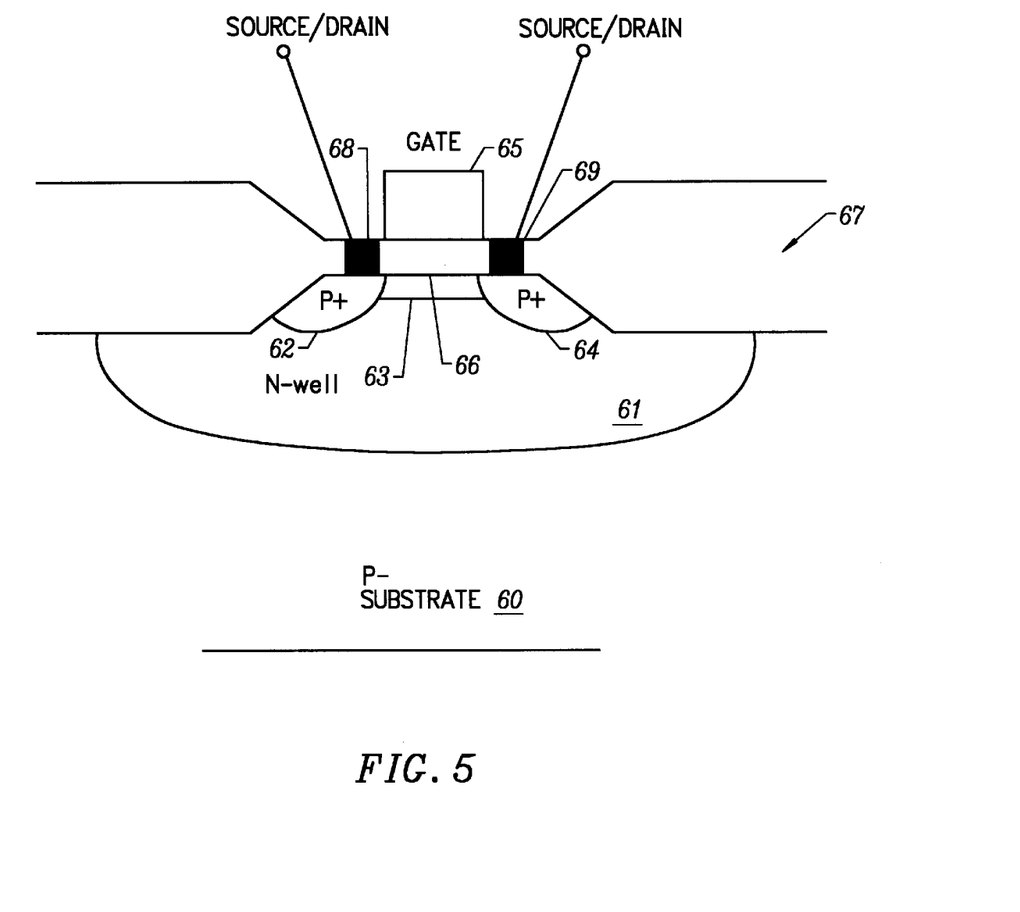
FIG. 5 presents a cross-sectional side view of a p-channel electrostatic discharge shunting transistor according to the present invention.

FIG. 5 presents a cross-sectional side view of the ESD protection device according to the present invention. As shown in FIG. 5, the ESD protection device is represented as a p-channel MOSFET. The MOSFET is formed on a p-type semiconductor substrate 60 having a well of n-type impurities 61 formed therein. Formed on the n-well 61 is a first source/drain region 62 which is heavily doped with a p-type dopant such as, for example, boron. Also formed on the N-well 61 is a second source/drain region 64 heavily doped with a p-type dopant such as, for example, boron. Formed between the first source/drain region 62 and the second source/drain region 64 is a shallow p-type channel region 63 having a channel resistance in the range of between approximately 1 k$\Omega$–1 G$\Omega$. In application, the preferable channel resistance is one that results in approximately 1 $\mu$A of current for a normal applied voltage. A control gate 65 is separated from the channel region 63 by an oxide 66. Contact regions 68, 69 are formed in the oxide 66 to provide outside connections to the first source/drain region 62 and the second source/drain region 64, respectively. The p-type channel region 63 has dopants implanted therein which provide a turn-off threshold voltage ($V_t$) that is lower than the operating voltage $V_{DD}$ of the device being protected.

Figure 6:
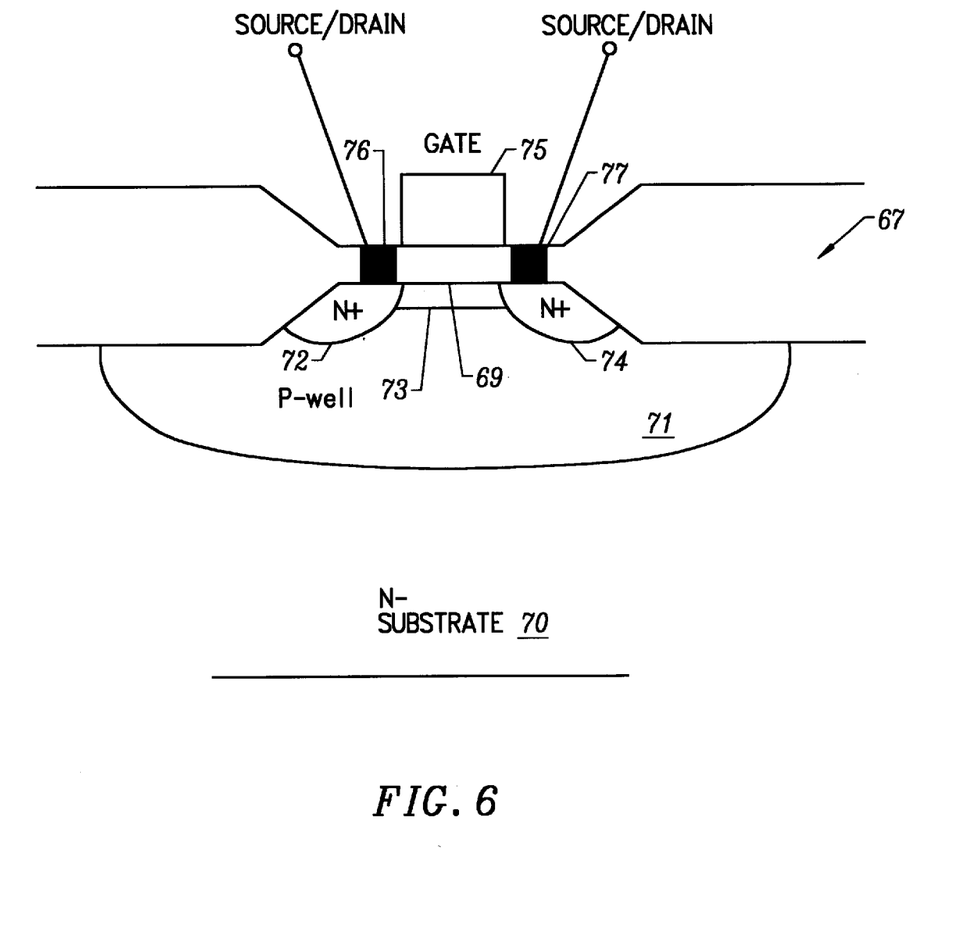
FIG. 6 presents a cross-sectional side view of an n-channel electrostatic discharge protection device according to the present invention.

FIG. 6 presents a cross-sectional side view of an n-channel depletion mode MOSFET which comprises a second embodiment of the ESD protection device of the present invention. In FIG. 6, an n-type substrate 70 has formed thereon a well 71 doped with p-type dopants such as, for example, boron. Formed on the P-well 71 is a first source/drain region 72 heavily doped with an n-type dopant such as, for example, arsenic or phosphorous. Also formed on the P-well 71 is a second source/drain region 74 which is heavily doped with an n-type impurity such as, for example, arsenic or phosphorous. Separating the first source/drain region 72 and the second source/drain region 74 is a shallow n-type channel region 73 having an implant which will adjust the turn-off threshold voltage $V_t$ of the ESD protection device (transistor) to be less than the normal operating voltage $V_{DD}$ of the integrated circuit device being protected. The channel region 73 is doped to have a channel resistance in the range of between approximately 1 k$\Omega$–1 G$\Omega$. A control gate 75 is separated from the channel region 73 by oxide 69. Contact regions 76 and 77 are formed in the oxide 67 to provide outside connections to the first source/drain region 72 and the second source/drain region 74, respectfully.

Figure 7:
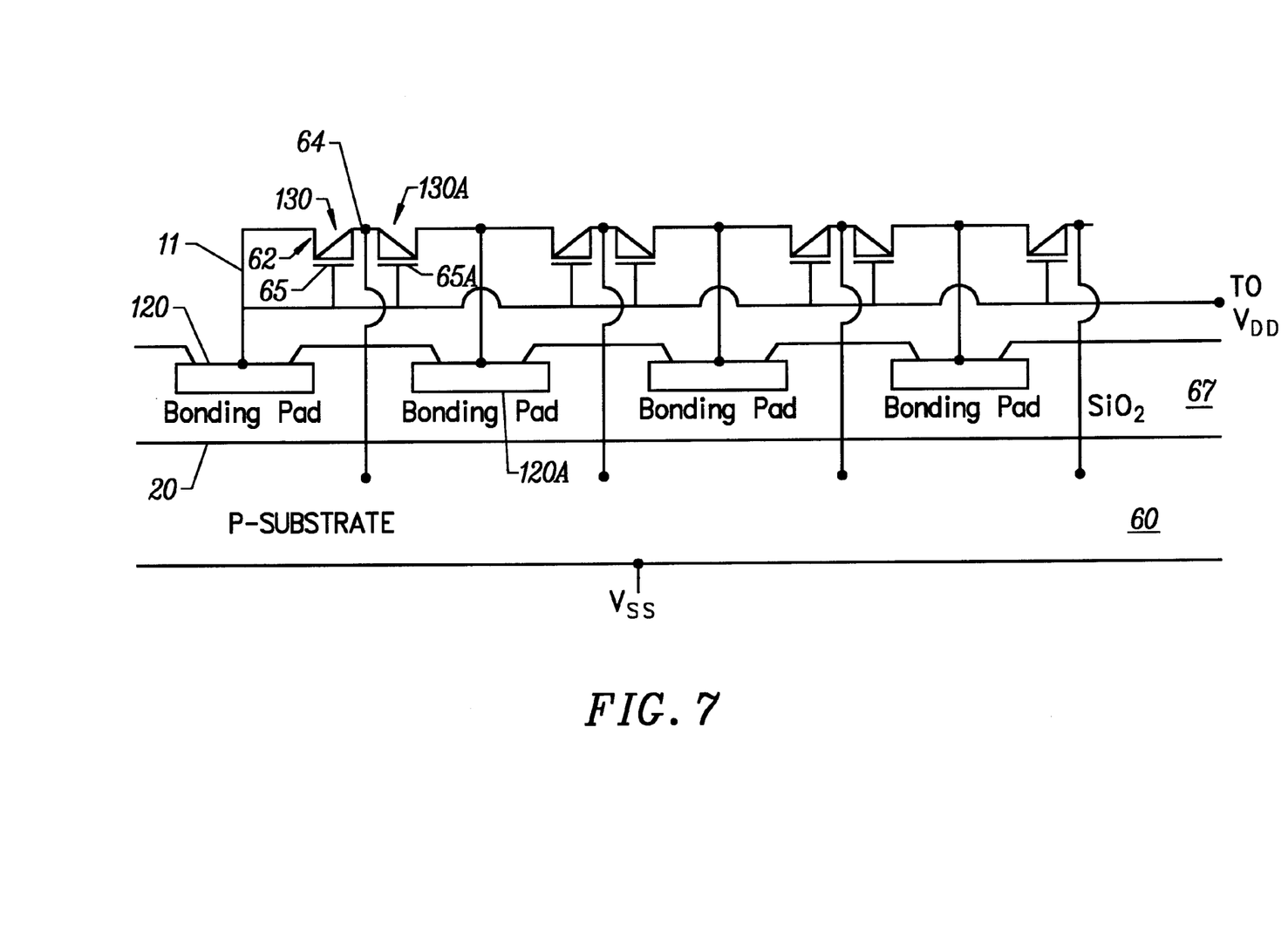
FIG. 7 presents a cross-sectional side view of an integrated circuit structure incorporating the electrostatic discharge protection device according to a first embodiment of the present invention.

FIG. 7 presents a cross-sectional side view of an integrated circuit structure incorporating the ESD protection device according to a first embodiment of the present invention. As shown in FIG. 7, the integrated circuit structure comprises a p-type semiconductor substrate 60 having a silicon dioxide layer 67 formed thereon. Within the substrate 60 is the internal circuit (110, FIG. 1) for which ESD protection is required. Coupled to the silicon dioxide layer 67 are a series of bonding pads 120 used for connecting the internal circuit (formed within the substrate 60) to external devices.

According to the present invention, a first ESD protection device 130 has a control gate 65 connected to $V_{DD}$. A first active device region, such as a source/drain region, 62 of the first protection device 130 is connected to a first bonding pad 120 via line 11. A second active device region, such as a source/drain region, 64 of the first ESD protection device 130 is connected to the first source/drain region of a second ESD protection device 130a. The second source/drain region 64 of the first ESD protection device 130 is also coupled to the substrate 60 which is coupled to $V_{SS}$, or ground potential. The control gate 65a of the second ESD protection device 130a is also coupled to $V_{DD}$, with the second source/drain region of the second ESD protection device 130a coupled to a second bonding pad 120a. The remaining bonding pads are connected to ESD protection devices in the same manner as described above. With this configuration, any electrostatic charge that is present on either the internal circuit or the various bonding pads of the IC structure will be shunted to ground potential.

For example, during product manufacturing, no power is provided to the integrated circuit formed within the substrate 60. During this period, the p-type ESD protection devices 130, 130a are turned on and are providing a static charge leakage pathway to ground potential; thereby preventing the accumulation of any electrostatic charge during handling or manufacturing steps from wafer fab, or from electrical test and package assembly.

During operation of the integrated circuit device, when the power supply is turned on ($V_{DD}$ is high), the gate 65 of the p-channel ESD protection device 130 goes positive, which turns the ESD protection device off. At this point, current flow from the bonding pad 120 to the substrate 60 is prevented. When power is supplied to the integrated circuit, ESD shunting is not necessary because electrostatic charge is not present on the integrated circuit, because all of the pins are connected to normal circuit operating voltages.

By connecting the control gate 65 of the ESD protection device 130 to $V_{DD}$, an ESD hazard to the protection device is presented. To mitigate such a hazard, a resistance may be added to the control gate of the ESD protection device to provide a resistance path for any electrostatic charge that may be present on the control gate of the ESD protection device themselves.

Figure 8:
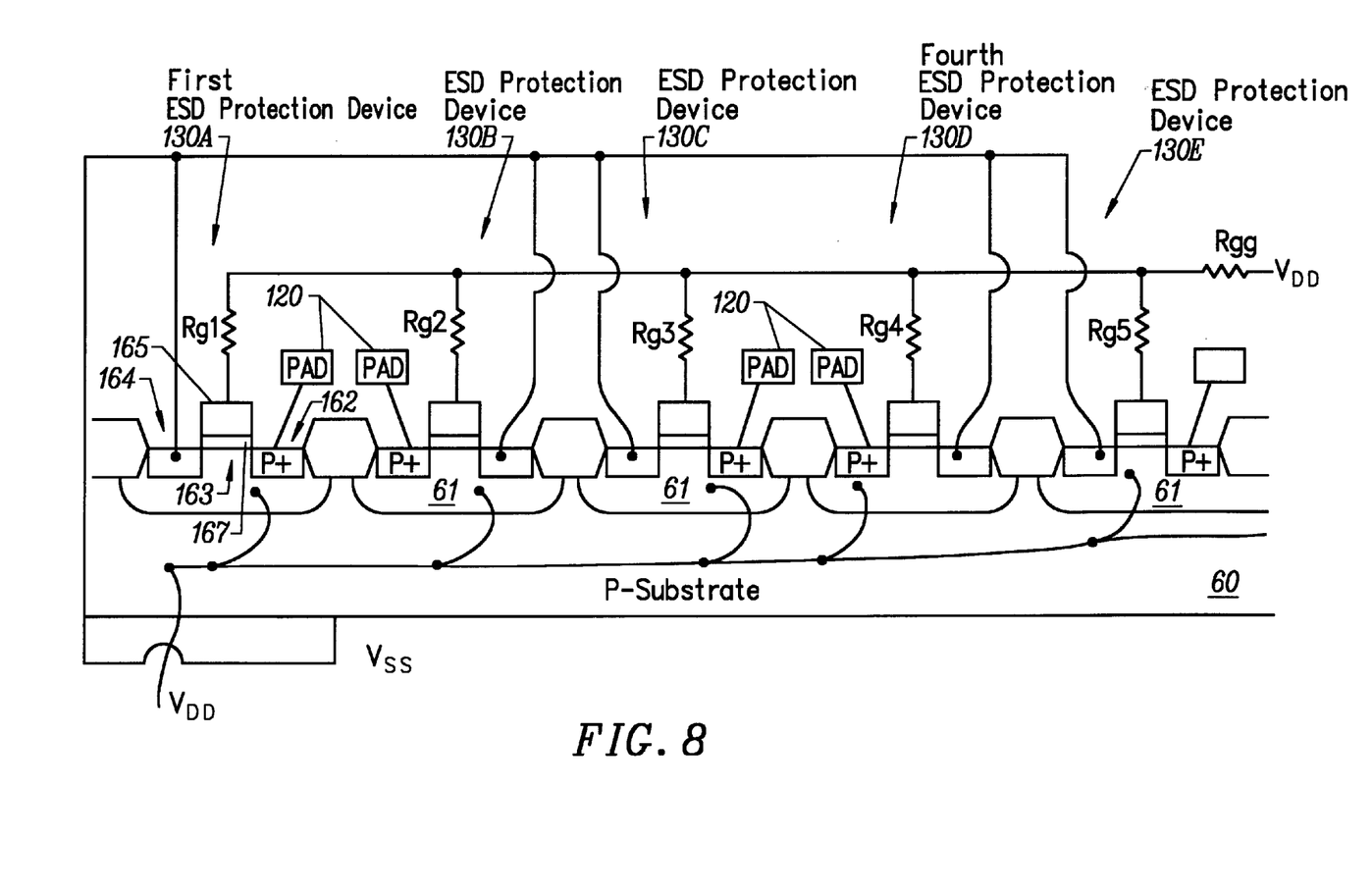
FIG. 8 presents a cross-sectional side view of an integrated circuit structure incorporating the electrostatic discharge protection device according to a second embodiment of the present invention.

FIG. 8 presents a second embodiment of the present invention where electrostatic charge that is present on the control gate of the ESD protection device is accounted for. In FIG. 8, an IC structure is shown having a p-type semiconductor substrate 60 having a plurality of wells 61 doped with n-type dopants formed therein. Within each respective N-well 61 is a first drain/source region 164 that is heavily doped with a p-type dopant such as, for example, boron. The first drain/source region 164 is coupled to $V_{SS}$ which is normally held at ground potential. A second drain/source region 162, heavily doped with a p-type dopant such as, for example, boron, is also formed in the N-well 61 and is coupled to a bonding pad 120. A channel region 163 separates the first drain/source region 164 and the second drain/source region 162 and provides for a current flow of approximately 1 μA between the source and drain regions when a voltage, $V_{DD}$, is applied to the IC structure. A control gate 165 is separated from the channel 163 via gate oxide layer 167. Coupled to the control gate 165 is a first gate ballast resistor $R_{g1}$, which is used to provide a resistance path for any static charge that may be present on the control gate 165. The first gate ballast resistor, $R_{g1}$, serves to ballast peak electrostatic charge caused by human handling. As shown in FIG. 8, the IC structure contains five N-wells 61. Each N-well has formed thereon an ESD protection device 130a–130e (FIGS. 5 and 6) according to the present invention.

The control gate 165 of the first ESD protection device 130a has a gate ballast resistor $R_{g1}$ coupled thereto. The first gate ballast resistor $R_{g1}$ is coupled to a second gate ballast resistor $R_{g2}$ which is coupled to the control gate of a second ESD protection device 130b. A third gate ballast resistor $R_{g3}$, connected to the control gate of a third ESD protection device 130c, is coupled to the first and second gate ballast resistors $R_{g1}$ and $R_{g2}$, respectively. Coupled to the third gate ballast resistor $R_{g3}$ is a fourth gate ballast resistor $R_{g4}$ which is coupled to the control gate of a fourth ESD protection device 130d. Coupled to the fourth gate ballast resistor $R_{g4}$ is a fifth gate ballast resistor $R_{g5}$ which is coupled to the control gate of a fifth ESD protection device 130e. Each of the gate ballast resistors $R_{g1}$–$R_{g5}$ are then connected in series to a group ballast resistor $R_{gg}$ which is used to provide a resistance path for any electrostatic charge present on the individual ESD protection devices, 130a–130e.

The gate ballast resistors $R_{g1}$–$R_{g5}$, in series with the group ballast resistor $R_{gg}$, are intended to operate as a single ballast resistor to protect the ESD protection devices from electrostatic discharge stemming from human or machine handling while, at the same time, not adversely affecting the intended operation of the ESD protection devices in their discharging of package or pin surface charge dissipation. In this manner, both electrostatic charge that is present on the metal portions of the internal circuitry of the IC structure and the electrostatic charge present on the individual protection devices is shunted to ground potential. When the IC formed within the p-type substrate 60 is operating, $V_{DD}$ is applied at the control gates of each of the ESD protection devices (130a–130e). At this point, the respective control gates become positive, which turns the protection devices off, thereby preventing current flow from the bonding pads to the substrate.

Each of the gate ballast resistors $R_{g1}$–$R_{g5}$ has a value in the range of between tens of ohms to thousands of ohms (approximately 5 ohms–50,000 ohms). The group ballast resistor $R_{gg}$ has a value in the range of between tens of ohms to thousands of ohms (approximately 500 ohms–50,000 ohms). It should be noted that the group ballast resistor may have a resistance value larger than the value of the gate ballast resistor. However, the resistance values are layout dependent and may have values outside the ranges presented above. For the embodiment shown in FIG. 8, a typical value of the individual ballast resistors and the group ballast resistor is shown below in Table 1.

TABLE 1

| Resistor | Value (kΩ) |
| --- | --- |
| $R_{g1}$ | 5 |
| $R_{g2}$ | 5 |

TABLE 1-continued

| Resistor | Value (kΩ) |
| --- | --- |
| $R_{g3}$ | 5 |
| $R_{g4}$ | 5 |
| $R_{g5}$ | 5 |
| $R_{gg}$ | 5 |

The individual gate ballast resistors, $R_{g1}$–$R_{g5}$, and the group ballast resistor, $R_{gg}$ are used to mitigate any differences in the gate voltage fluctuations from one device to the next during both non-operating periods and during operation with $V_{DD}$ power and to provide ballast for peak energies dissipated during human and machine discharges to mitigate any one ESD protection device from discharge energy. The group ballast resistor, $R_{gg}$, may require a large resistance that is impractical for each individual gate due to layout area. Since the control gate of the ESD protection devices 130a–130e does not draw much current while operating, a large group ballast resistor value is more practical to protect the individual ESD protection device.

In FIG. 8, the gate ballast resistors are shown connected in series to the control gate of each individual protection device. Other connections are possible to provide the same protection. For example, the gate ballast resistors $R_{g1}$–$R_{g5}$ could be eliminated and the control gates of the ESD protection devices can be tied together and then connected to the group ballast resistor, $R_{gg}$. Another alternative would be to connect each control gate to a gate ballast resistor and then connect the control gates (including the ballast resistance) directly to $V_{DD}$ thus eliminating the group ballast resistor, $R_{gg}$.

FIGS. 7 and 8 have been discussed with respect to p-type ESD protection devices. However, if the internal circuitry is formed on an n-type substrate, n-channel ESD protection devices would be used.

Figure 9:
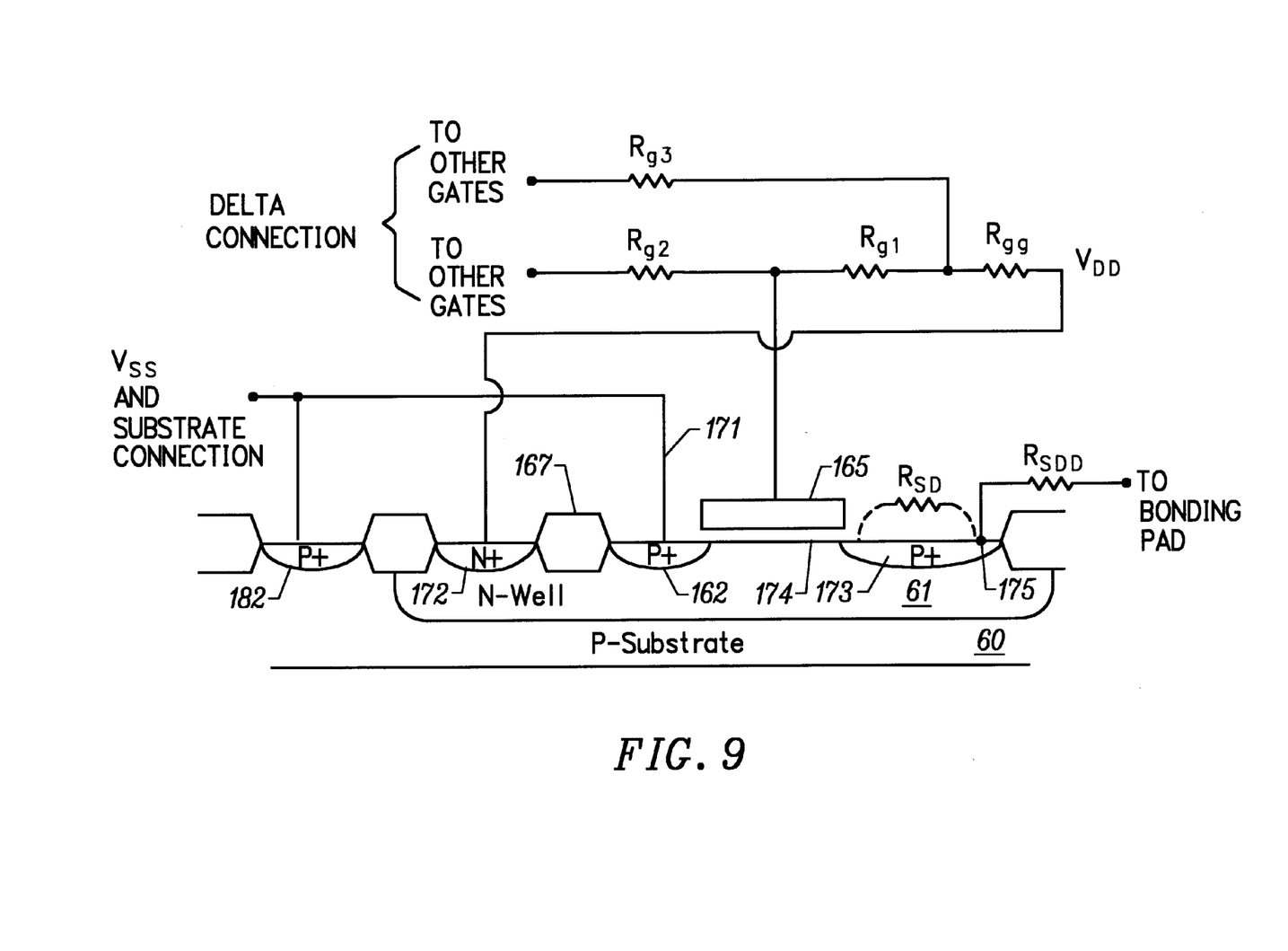
FIG. 9 presents a cross-sectional view of an integrated circuit structure including the electrostatic discharge protection device of the present invention having a Delta connection.

Referring to FIG. 9, a cross-sectional side view of an ESD protection device and underlying internal circuitry connected in a Delta fashion is shown. In FIG. 9, a p-type substrate 60 has an N-well 61 formed therein. The substrate 60 is connected to $V_{SS}$ through a P+ region 182. On the N-well 61 is an ESD protection device comprising a well contact 172 of n-type semiconductor material such as, for example, arsenic or phosphorous, connected to $V_{DD}$. A control gate 165 is connected to $V_{DD}$ through a series resistance comprising a first gate ballast resistor $R_{g1}$ and a group ballast resistor $R_{gg}$. The power supply $V_{DD}$ Of the IC being protected is connected to the ESD protection device via the group ballast resistor $R_{gg}$. A first source/drain region 162 of the ESD protection device is connected to $V_{SS}$ via line 171. A second source/drain region 173 is connected to a bonding pad (not shown). A channel region 174 separates the first source/drain region 162 and the second source/drain region 173. The connection of the second source/drain region 173 and bonding pad may be made directly, or alternatively through an intrinsic ballast resistance $R_{SD}$ represented as a resistor coupled to the second source/drain region 173 by dotted lines and/or through an extrinsic ballast resistor $R_{SDD}$.

The intrinsic ballast resistance is the resistance present through the second source/drain region 173 from the end adjacent the channel 174 to the contact point 175 of the second source/drain region 173 and the bonding pad. The value of the extrinsic ballast resistor $R_{SDD}$ may be in the range of approximately 50 ohms–500 ohms, and preferably 5000 ohms. The embodiment presented in FIG. 9 is used for protection of excessive ESD fault currents from the bonding pad to the protection device. Such protection is accomplished by using added ballast resistance. This resistance can be added in several ways. One way is to use the intrinsic source/drain resistance, $R_{SD}$, of the protection device. This resistance is increased by displacing the source/drain contact from the gate electrode by several microns to tens of microns. The intrinsic ballast resistance $R_{SD}$ cannot be made very large, but is very effective at spreading current uniformly when in turn, spreads power dissipation uniformly. Uniform power dissipation is key to effective electrostatic discharge structure design. The values for the intrinsic resistance and the extrinsic ballast resistor for the embodiment shown in FIG. 9 are shown below in Table 2. An extrinsic ballast resistor $R_{SDD}$ may be used in addition to or as an alternative to the intrinsic ballast resistance $R_{SD}$. The extrinsic ballast resistor, $R_{SDD}$ may be constructed, for example, by using a polysilicon or polycide resistor.

TABLE 2

| Resistor | Value (kΩ) |
| --- | --- |
| $R_{SD}$ | 500 |
| $R_{SDD}$ | 5000 |

Also presented in FIG. 9 are gate ballast resistors $R_{g2}$ and $R_{g3}$. Each of these resistors is connected to the control gates of other ESD protection devices in a similar fashion to that presented in FIG. 9.

Figure 10:
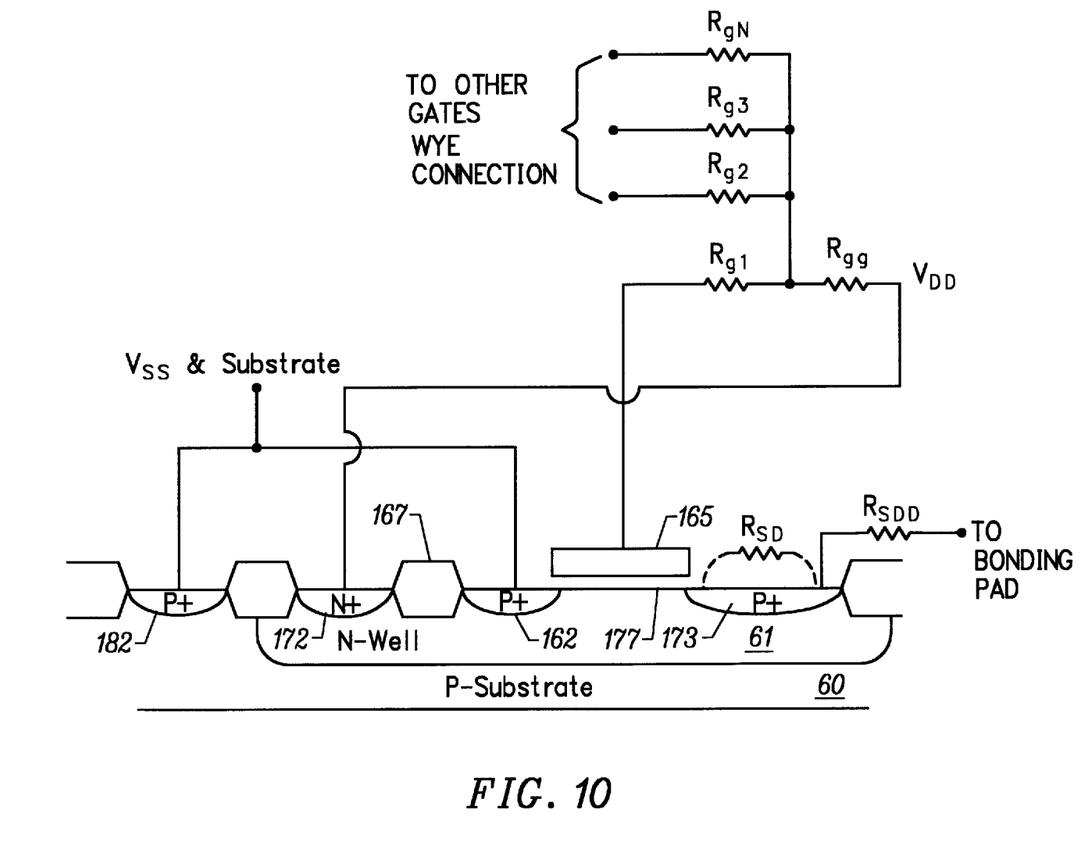
FIG. 10 presents a cross-sectional side view of an integrated circuit structure incorporating the electrostatic discharge protection device of the present invention having a Wye connection.

FIG. 10 shows a schematic cross-section of the Wye connection of the ESD protection device and the internal circuit to be protected. As shown in FIG. 10, a p-type semiconductor substrate 60 having an internal circuit formed thereon includes an n-well 61 of n-type dopant impurities having formed thereon a source 172 heavily doped with an n-type material such as, for example, arsenic or phosphorous being connected to a resistive network including gate ballast resistor $R_{g1}$ and group ballast resistor $R_{gg}$ connected in series to the control gate 165 of the ESD protection device. The substrate 60 is coupled to $V_{SS}$ via P+ substrate connection 182. Also shown in FIG. 10 is a first source/drain region 162 heavily doped with p-type dopant impurities such as, for example, boron, coupled to $V_{SS}$ which is held at ground potential. A second source/drain region 173 is connected to a bonding pad (not shown) via an intrinsic resistance (represented as resistor $R_{SD}$) and an extrinsic resistor $R_{SDD}$, which is used to limit peak current and to dissipate fault condition energy. A channel region 177 separates the first source/drain region 162 and the second source/drain region 173. The connection of the second source/drain region 173 and the bonding pad (not shown) may be done using both the intrinsic resistance $R_{SD}$ and the extrinsic resistor $R_{SDD}$. It may be done with either the intrinsic resistance $R_{SD}$ or the extrinsic resistance $R_{SDD}$, or it may be done without either resistance. The extrinsic resistor $R_{SDD}$ may be constructed by using, for example, a polysilicon or polycide resistor. The values for the gate ballast resistors, the group ballast resistors and extrinsic resistor $R_{SDD}$ for the embodiment shown in FIG. 10 are presented in Table 3 below.

TABLE 3

| Resistor | Value (kΩ) |
| --- | --- |
| $R_g$ | 5 |
| $R_{gg}$ | 5 |
| $R_{SD}$ | 5 |
| $R_{SDD}$ | 5 |

The other gate ballast resistors $R_{g2}$–$R_{gN}$ are coupled to the control gates of other ESD protection devices in a similar fashion to that shown in FIG. 10.

The Wye connection as shown in FIG. 10 provides that each individual bonding pad has its own particular resistance path to ground potential in the event of electrostatic charge being built up on the internal circuitry, the bonding pads or the ESD shunting device itself.

The foregoing description of the embodiments has been presented for the purposes of illustration and description. It is not intended to be exhaustive or to limit the invention to the precise form disclosed, and obviously, modifications and variations of the invention are possible in light of the above teaching. The switchable ESD protective shunting circuit for semiconductor devices was described in order to best describe the principles of the invention and its practical application to thereby enable others skilled in the art to best utilize the invention and various embodiments and with various modifications as are suited to the particular use contemplated. It is intended that the scope of the invention be defined by the claims appended hereto.

We claim:

1. A circuit providing electrostatic discharge protection, comprising:

a device having a plurality of bonding pads, each of said bonding pads configured to connect said device to external circuitry;

a plurality of first shunting transistors, each of said plurality of first shunting transistors having a first active region coupled to a respective one of said plurality of bonding pads, a second active region coupled to ground, and a gate coupled to a power source, wherein electrostatic charge is passed to ground when power is not provided by said power source;

a plurality of second shunting transistors, each of said plurality of second shunting transistors having a first active region coupled to said second active region of a respective one of said plurality of first shunting transistors, a second active region coupled to a next successive one of said plurality of bonding pads, and a gate coupled to said gate of said respective one of said plurality of first shunting transistors; and ballast resistance coupled between each respective gate of said plurality of first and second shunting transistors and to said power source.

2. The circuit of claim 1, wherein each of said plurality of first shunting transistors is a p-type transistor.

3. The circuit of claim 1, wherein each of said plurality of first shunting transistors is a n-type transistor.

4. The circuit of claim 1, wherein each of said first active regions is a source.

5. The circuit of claim 4, wherein each of said second active regions is a drain.

6. The circuit of claim 1, wherein each of said first active regions is a drain.

7. The circuit of claim 6, wherein each of said second active regions is a source.

8. The circuit of claim 1, wherein said ballast resistance includes a gate resistance and a group resistor, said gate resistance coupled to each respective gate of said plurality of first and second shunting transistors and said group resistor coupled between said gate resistance and said power source.

9. The circuit of claim 8, wherein said group resistor has a value in the range of approximately 500 Ω–50 kΩ.

10. The circuit of claim 1, wherein each of said first shunting transistors is coupled to said device in a delta configuration.

11. The circuit of claim 1, wherein each of said first shunting transistors is coupled to said device in a wye configuration.

12. The circuit of claim 1, wherein each of said second shunting transistors is coupled to said device in a delta configuration.

13. The circuit of claim 1, wherein each of said second shunting transistors is coupled to said device in a wye configuration.

14. An electrostatic discharge protection device for semiconductors, comprising:
  a circuit formed on a semiconductor substrate, said circuit including a bonding pad;
  a transistor having a source, drain and gate, said source coupled to said bonding pad, said drain coupled to ground, said gate coupled to a power supply, said transistor providing a current path to ground potential for electrostatic charge from said circuit to flow when power is not provided to said circuit, wherein upon application of a voltage to said circuit, said current path is removed; and
  ballast resistance coupled between said gate and to said power supply, said ballast resistance including a group ballast resistor coupled, in series, to a gate ballast resistor.

15. The electrostatic discharge protection device of claim 14, wherein said transistor is a p-type depletion mode transistor.

16. The electrostatic discharge protection device of claim 14, wherein said transistor is an n-type transistor.

17. The electrostatic discharge protection device of claim 14, wherein said gate ballast resistor has a value in the range of tens of ohms to thousands of ohms.

18. The electrostatic discharge protection device of claim 14, wherein said group ballast resistor has a value in the range of tens of ohms to thousands of ohms.

19. A circuit, comprising:
  a substrate of semiconductor material having a circuit formed thereon, said substrate having a first conductivity type;
  a plurality of well regions, each of said well regions having a second conductivity type, said second conductivity type being different from said first conductivity type;
  a plurality of bonding pads for connecting said circuit to an external device;
  a plurality of transistors, one of said plurality being formed on each said well region, each of said plurality of transistors comprising:
    a source formed on a respective one of said plurality of well regions, said source coupled to said substrate,
    a drain formed on a respective one of said plurality of well regions, said drain coupled to said bonding pad,
    a channel formed between said source and said drain, said channel having a first conductivity type, and
    a control gate formed over said channel; and
  a group resistor coupled to a power source; and a plurality of ballast resistors, each ballast resistor coupled between said group resistor and said control gate of a respective one of said plurality of transistors.

20. The circuit of claim 19 wherein said group resistor has a resistance value larger than the value of each of said ballast resistors.

21. The circuit of claim 19 wherein said group resistor has a resistance value equal to the value of each of said ballast resistors.

22. The circuit of claim 19, wherein said first conductivity type is provided by doping said substrate with p-type dopants.

23. The circuit of claim 19, wherein said second conductivity is provided by doping said substrate with n-type dopants.

24. The circuit of claim 19, wherein said first conductivity type is provided by doping said substrate with n-type dopants.

25. The circuit of claim 19, wherein said second conductivity type is provided by doping said substrate with p-type dopants.

26. The circuit of claim 19, wherein each of said ballast resistors has a value in the range of approximately tens of ohms to thousands of ohms.

27. The circuit of claim 20, wherein said group resistor has a value in the range of approximately tens of ohms to thousands of ohms.

28. A circuit providing electrostatic discharge protection, comprising:
  a device having a plurality of bonding pads, each of said bonding pads configured to connect said device to external circuitry;
  a first shunting transistor coupled to said device in a delta configuration, said first shunting transistor having a first active region coupled to a respective one of said plurality of bonding pads, a second active region coupled to ground, and a gate coupled to a power source, wherein electrostatic charge is passed to ground when power is not provided by said power source;
  a second shunting transistor coupled to said device in a delta configuration, said second shunting transistor having a first active region coupled to said second active region of said first shunting transistor, a second active region coupled to a next successive one of said plurality of bonding pads, and a gate coupled to said gate of said first shunting transistor; and
  ballast resistance coupled between each respective gate and to said power source.

29. The circuit of claim 28, wherein said first shunting transistor is a p-type transistor.

30. The circuit of claim 28, wherein said first shunting transistor is a n-type transistor.

31. The circuit of claim 28, wherein each of said first active regions is a source.

32. The circuit of claim 31, wherein each of said second active regions is a drain.

33. The circuit of claim 28, wherein each of said first active regions is a drain.

34. The circuit of claim 33, wherein each of said second active regions is a source.

* * * * *